United States Patent
Fan

(10) Patent No.: US 12,109,627 B2
(45) Date of Patent: Oct. 8, 2024

(54) COATED CUTTING TOOL

(71) Applicant: TUNGALOY CORPORATION, Fukushima (JP)

(72) Inventor: Cangyu Fan, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 0 days.

(21) Appl. No.: 17/687,730

(22) Filed: Mar. 7, 2022

(65) Prior Publication Data

US 2022/0362860 A1 Nov. 17, 2022

(30) Foreign Application Priority Data

Apr. 30, 2021 (JP) ................................. 2021-077156

(51) Int. Cl.
| | |
|---|---|
| *B23B 27/14* | (2006.01) |
| *B23C 5/16* | (2006.01) |
| *C23C 16/02* | (2006.01) |
| *C23C 16/34* | (2006.01) |
| *C23C 16/40* | (2006.01) |
| *C23C 30/00* | (2006.01) |

(52) U.S. Cl.
CPC .............. *B23B 27/148* (2013.01); *B23C 5/16* (2013.01); *C23C 16/0227* (2013.01); *C23C 16/0272* (2013.01); *C23C 16/34* (2013.01); *C23C 16/403* (2013.01); *C23C 30/005* (2013.01); *B23B 2228/105* (2013.01)

(58) Field of Classification Search
None
See application file for complete search history.

(56) References Cited

U.S. PATENT DOCUMENTS

| | | | |
|---|---|---|---|
| 2010/0323176 A1* | 12/2010 | Van Den Berg | ...... C23C 30/005 428/697 |
| 2020/0002819 A1 | 1/2020 | Stiens et al. | |
| 2020/0306837 A1* | 10/2020 | Engqvist | ............ C23C 16/0272 |

FOREIGN PATENT DOCUMENTS

| | | | |
|---|---|---|---|
| JP | 4107433 B2 * | 6/2008 | |
| JP | 2011-516722 A | 5/2011 | |
| JP | 2020-506811 A | 3/2020 | |

OTHER PUBLICATIONS

Translation—JP-4107433-B2; Fukunaga et al.; Jun. 2008 (Year: 2008).*

* cited by examiner

*Primary Examiner* — Humera N. Sheikh
*Assistant Examiner* — Elizabeth D Ivey
(74) *Attorney, Agent, or Firm* — Studebaker & Brackett PC

(57) ABSTRACT

A coated cutting tool, comprising: a substrate; and a coating layer formed on a surface of the substrate, wherein the coating layer includes a lower layer and an upper layer in this order from the substrate side toward the surface side of the coating layer, and the upper layer is formed on a surface of the lower layer, the lower layer contains a compound having a composition represented by $(Al_xTi_{1-x})N$, an average thickness of the lower layer is 1.0 μm or more and 15.0 μm or less, the upper layer contains an $\alpha$-$Al_2O_3$ layer containing $\alpha$-$Al_2O_3$, an average thickness of the upper layer is 0.5 μm or more and 15.0 μm or less, and in the $\alpha$-$Al_2O_3$ layer, a texture coefficient TC (1, 1, 6) of a (1, 1, 6) plane is 2.0 or more and 6.0 or less.

20 Claims, 1 Drawing Sheet

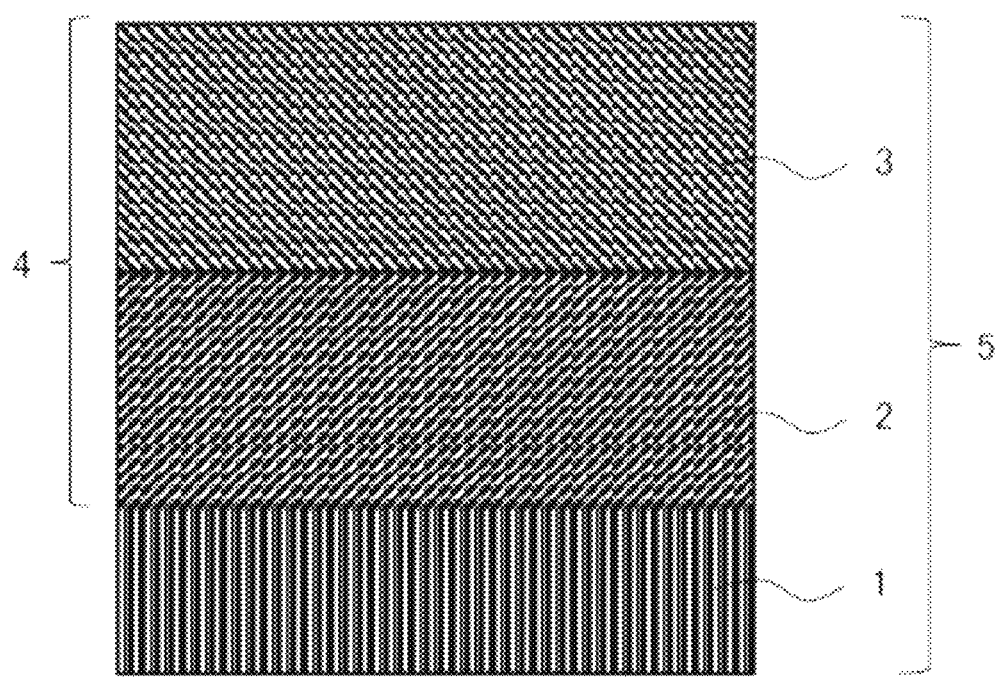

COATED CUTTING TOOL

BACKGROUND OF THE INVENTION

Field of the Invention

The present invention relates to a coated cutting tool.

Description of Related Art

It is conventionally well known that coated cutting tools obtained by vapor deposition forming, on a surface of a substrate made of a cemented carbide, a coating layer with a total thickness of 3 μm to 20 μm by chemical vapor deposition, are used for cutting steel, cast iron, and the like. A known example of the coating layer is a coating layer made of a single layer of one kind selected from a group consisting of carbide, nitride, carbonitride, oxycarbide and oxicarbonitride, of Ti, and aluminum oxide ($Al_2O_3$), or made of a plurality of layers of two or more kinds selected therefrom.

There also is known coated cutting tools obtained by vapor deposition forming a Ti—Al complex nitride layer by physical vapor deposition on a surface of a substrate made of a cemented carbide or a cubic boron nitride sintered body, and these are known to exhibit excellent wear resistance. However, while the conventional coated cutting tools obtained by forming a Ti—Al complex nitride layer by physical vapor deposition have relatively favorable wear resistance, cracks readily occur in a case of using in working under high-speed and intermittently-loaded cutting conditions, and accordingly various proposals have been made for improvement in the coating layer.

For example, Japanese Translation of PCT Application No. 2011-516722 discloses a body coated with a hard material, having a plurality of layers applied by CVD, with an $Al_2O_3$ layer being disposed as an outer layer on a $Ti_{1-x}Al_xN$ layer and/or a $Ti_{1-x}Al_xC$ layer and/or a $Ti_{1-x}Al_xCN$ layer (where 0.7≤x≤0.9 in the formulas), in which a TiN layer and/or a TiCN layer is a joint layer for a substrate body made of cemented carbide, cermet, or ceramic, the $Ti_{1-x}Al_xN$ layer and/or the $Ti_{1-x}Al_xCN$ layer contains hexagonal AlN, with 25% or less hexagonal AlN being present.

For example, Japanese Translation of PCT Application No. 2020-506811 discloses a coated cutting tool including a substrate and a coating, the coating including at least one of an inner layer of 4 μm to 14 μm thick $Ti_{1-x}Al_xN$, an intermediate layer of 0.05 μm to 1 μm thick TiCN, and an outer layer of 1 μm to 9 μm thick α-$Al_2O_3$, in which the α-$Al_2O_3$ layer exhibits an X-ray diffraction pattern, in a case of measuring using CuKα rays and theta-2theta scan, and the texture coefficient TC (h, k, l) is defined according to Harris formula $$TC(hkl) = \frac{I(hkl)}{I0(hkl)}\left[\frac{1}{n}\sum_{i=0}^{n}\frac{I(hkl)}{I0(hkl)}\right]^{-1}$$

where, in the formula, the (h, k, l) reflections used are (0, 2, 4), (1, 1, 6), (3, 0, 0), and (0, 0, 12), I(h, k, l)=measured intensity (peak intensity) of the (h, k, l) reflection, I0(h, k, l)=standard intensity according to ICDD PDF Card No. 00-042-1468, n=number of reflections used in calculation, and 3<TC(0, 0, 12)<4.

SUMMARY

Technical Problem

The demand in recent years for work conservation and energy conservation in cutting is great, and thus cutting is in an increasingly high-speed and high-efficiency trend. Accordingly, wear resistance is demanded of coated cutting tools even more, and also excellent chipping resistance and fracture resistance over prolonged periods of use are demanded.

Japanese Translation of PCT Application No. 2011-516722 discloses using an object coated with a hard material containing an $Al_2O_3$ layer, but no consideration whatsoever is given to the properties of the $Al_2O_3$ layer. Accordingly, object coated with the hard material disclosed in Japanese Translation of PCT Application No. 2011-516722 has insufficient wear resistance and fracture resistance, and there is room for improvement.

The coated cutting tool described in Japanese Translation of PCT Application No. 2020-506811 includes an α-$Al_2O_3$ layer oriented to a (0, 0, 12) plane, and accordingly crater wear resistance is improved. However, the α-$Al_2O_3$ layer oriented to the (0, 0, 12) plane may have insufficient adhesion to a TiAlN layer that is an intermediate layer. Accordingly, the coated cutting tool described in Japanese Translation of PCT Application No. 2020-506811 may exhibit chipping due to particle drop-out, and thus fracture resistance is insufficient and there is room for improvement.

The present invention has been made in light of the foregoing circumstances, and accordingly, an object thereof is to provide a coated cutting tool which has excellent wear resistance and fracture resistance and which accordingly allows for an extended tool life.

Solution to Problem

The present inventor has undertaken research regarding extending the tool life of coated cutting tools from the perspective described above. As a result, it has been found that by the coating layer of the coated cutting tool including a lower layer containing a compound layer of a particular composition, and an upper layer containing an α-$Al_2O_3$ layer, in this order, and controlling a texture coefficient TC (1, 1, 6) of a (1, 1, 6) plane within the α-$Al_2O_3$ layer to a particular range, not only is crater wear resistance excellent but also fracture resistance is excellent in particular due to improved adhesion, and consequently the tool life of the coated cutting tool can be extended, and has completed the present invention.

That is to say, the essence of the present invention is as follows.

[1] A coated cutting tool, including a substrate and a coating layer formed on a surface of the substrate, wherein
the coating layer includes a lower layer and an upper layer in this order from the substrate side toward the surface side of the coating layer, and the upper layer is formed on a surface of the lower layer,
the lower layer contains a compound having a composition represented by the following Formula (1)

$(Al_xTi_{1-x})N$     (1)

where, in Formula (1), x represents an atomic ratio of an Al element as to a sum of the Al element and a Ti element, and 0.70≤x≤0.90 is satisfied, an average thickness of the lower layer is 1.0 µm or more and 15.0 µm or less, the upper layer contains an α-Al$_2$O$_3$ layer containing α-Al$_2$O$_3$, an average thickness of the upper layer is 0.5 µm or more and 15.0 µm or less, and in the α-Al$_2$O$_3$ layer, a texture coefficient TC (1, 1, 6) of a (1, 1, 6) plane represented by the following Formula (2) is 2.0 or more and 6.0 or less $$TC(1, 1, 6) = \frac{I(1, 1, 6)}{I_0(1, 1, 6)} \left\{ \frac{1}{9} \sum \frac{I(h, k, l)}{I_0(h, k, l)} \right\}^{-1} \quad (2)$$

where, in Formula (2), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

[2] The coated cutting tool according to [1], wherein in the α-Al$_2$O$_3$ layer, a texture coefficient TC (0, 2, 10) of a (0, 2, 10) plane represented by the following Formula (3) is 1.0 or more and 3.0 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

where, in Formula (3), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

[3] The coated cutting tool according to [1] or [2], wherein in the α-Al$_2$O$_3$ layer, a texture coefficient TC (0, 0, 12) of a (0, 0, 12) plane represented by the following Formula (4) is 1.0 or more and 4.0 or less $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formula (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

[4] The coated cutting tool according to any one of [1] to [3], wherein in the α-Al$_2$O$_3$ layer, a sum of the texture coefficient TC (1, 1, 6), the texture coefficient TC (0, 2, 10) of the (0, 2, 10) plane represented by the following Formula (3), and the texture coefficient TC (0, 0, 12) of the (0, 0, 12) plane represented by the following Formula (4) is 5.0 or more and 8.5 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

-continued
$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formulas (3) and (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

[5] The coated cutting tool according to any one of [1] to [4], wherein an average grain size of grains of the α-Al$_2$O$_3$ layer is 0.2 µm or more and 0.5 µm or less.

[6] The coated cutting tool according to any one of [1] to [5], wherein an average thickness of the entire coating layer is 2.0 µm or more and 20.0 µm or less.

[7] The coated cutting tool according to any one of [1] to [6], wherein the substrate is any of a cemented carbide, a cermet, a ceramic, or a cubic boron nitride sintered body.

Advantageous Effects of Invention

The present invention can provide a coated cutting tool which has excellent wear resistance and fracture resistance, and which accordingly allows for an extended tool life.

BRIEF DESCRIPTION OF DRAWINGS

FIGURE is a schematic view showing an example of a coated cutting tool according to the present invention.

DETAILED DESCRIPTION

An embodiment for carrying out the present invention (hereinafter, simply referred to as the "present embodiment") will hereinafter be described in detail with reference to the attached drawings as appropriate, but the present invention is not limited to the following present embodiment. Various modifications may be made to the present invention without departing from the gist of the invention. In addition, in the drawings, unless otherwise specified, positional relationships, such as vertical and horizontal relationships, are presumed to be based on the positional relationships illustrated in the drawings. Further, the dimensional ratios of the drawings are not limited to those illustrated therein.

The coated cutting tool according to the present embodiment includes a substrate and a coating layer formed on a surface of the substrate, the coating layer includes a lower layer and an upper layer in this order from the substrate side toward the surface side of the coating layer, and the upper layer is formed on a surface of the lower layer, the lower layer contains a compound having a composition represented by the following Formula (1)

(Al$_x$Ti$_{1-x}$)N (1)

where, in Formula (1), x represents an atomic ratio of an Al element as to a sum of the Al element and a Ti element, and 0.70≤x≤0.90 is satisfied, an average thickness of the lower layer is 1.0 µm or more and 15.0 µm or less, the upper layer contains an α-Al$_2$O$_3$ layer containing α-Al$_2$O$_3$, an average thickness of the upper layer is 0.5 µm or more and 15.0 µm or less, and in the α-Al$_2$O$_3$ layer, a texture coefficient TC (1, 1, 6) of a (1, 1, 6) plane represented by the following Formula (2) is 2.0 or more and 6.0 or less $$TC(1, 1, 6) = \frac{I(1, 1, 6)}{I_0(1, 1, 6)} \left\{ \frac{1}{9} \sum \frac{I(h, k, l)}{I_0(h, k, l)} \right\}^{-1} \quad (2)$$

where, in Formula (2), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

Due to having the above configuration, wear resistance and fracture resistance of the coated cutting tool according to the present embodiment can be improved, and as a result, tool life can be extended. The factors of improved wear resistance and fracture resistance of the coated cutting tool according to the present embodiment can be thought as follows. It should be noted, however, that the present invention is not limited by the following factors in any way. That is to say, in the coated cutting tool according to the present embodiment, the coating layer includes the lower layer and the upper layer in this order from the substrate side toward the surface side of the coating layer, with the upper layer formed on the surface of the lower layer, and the lower layer containing a compound having a composition represented by the above Formula (1). When the atomic ratio x of the Al element in the above Formula (1) is 0.70 or more, the hardness of the coating layer improves due to solid solution strengthening, and thus wear resistance is improved, and also oxidation resistance improves due to increased Al content. As a result, the coated cutting tool according to the present embodiment has improved crater wear resistance, and accordingly fracture resistance is improved by suppressing deterioration in strength of the cutting edge. Also, when the atomic ratio x of the Al element in the above Formula (1) is 0.90 or less, the toughness of the coating layer improves due to containing Ti, and accordingly occurrence of thermal cracking can be suppressed. As a result, the fracture resistance of the coated cutting tool according to the present embodiment is improved. Also, the wear resistance of the coated cutting tool according to the present embodiment improves by the average thickness of the lower layer being 1.0 μm or more. Conversely, by the average thickness of the lower layer being 15.0 μm or less, in the coated cutting tool according to the present embodiment, adhesion to the substrate (e.g., cemented carbide) improves, and occurrence of thermal cracking can be suppressed, thereby improving fracture resistance. Also, the upper layer of the coated cutting tool according to the present embodiment contains an α-Al$_2$O$_3$ layer containing α-Al$_2$O$_3$ and thus is hard, thereby improving wear resistance. Also, when the average thickness of the upper layer is 0.5 μm or more, crater wear resistance of the coated cutting tool is improved. Conversely, when the average thickness of the upper layer is 15.0 μm or less, coarsening of grain size can be suppressed, and accordingly occurrence of fracturing due to chipping can be suppressed. As a result, the fracture resistance of the coated cutting tool according to the present embodiment is improved. Also, regarding the coated cutting tool according to the present embodiment, the texture coefficient TC (1, 1, 6) of the (1, 1, 6) plane is 2.0 or more in the α-Al$_2$O$_3$ layer, and accordingly adhesion improves, whereby fracture resistance is excellent. Conversely, regarding the coated cutting tool according to the present embodiment, when the texture coefficient TC (1, 1, 6) of the (1, 1, 6) plane is 6.0 or less in the α-Al$_2$O$_3$ layer, the proportion of the texture coefficient TC relatively increases in the (0, 0, 12) plane or the (0, 2, 10) plane, and accordingly crater wear resistance improves.

It is thought that by combining these configurations, the wear resistance and fracture resistance of the coated cutting tool according to the present embodiment are improved, and as a result, the tool life can be prolonged.

FIGURE is a cross-sectional schematic diagram illustrating an example of the coated cutting tool according to the present embodiment. The coated cutting tool 5 includes a substrate 1 and a coating layer 4 formed on the surface of the substrate 1. In the coating layer 4, a lower layer 2 and an upper layer 3 are stacked upward in this order (from the substrate side to the surface side of the coating layer).

The coated cutting tool according to the present embodiment includes the substrate and the coating layer formed on the surface of the substrate. Specific examples of the type of the coated cutting tool include an interchangeable cutting insert for milling or turning, a drill, and an end mill.

The substrate that is used in the present embodiment is not particularly limited as long as it may be used as a substrate for a coated cutting tool. Examples of such a substrate include a cemented carbide, a cermet, a ceramic, a cubic boron nitride sintered body, a diamond sintered body, and high-speed steel. Among these, the substrate is preferably one of a cemented carbide, a cermet, a ceramic or a cubic boron nitride sintered body, because more excellent wear resistance and fracture resistance can be realized, and from the same perspective, the substrate is more preferably a cemented carbide.

Note that the surface of the substrate may be modified. For example, in a case in which the substrate is made of a cemented carbide, a β-free layer may be formed on the surface thereof. Also, in a case in which the substrate is made of a cermet, a hardened layer may be formed on the surface thereof. The functions and effects of the present invention can be obtained even when the surface of the substrate is modified thusly.

The coating layer used in the present embodiment preferably has an average thickness of 2.0 μm or more and 20.0 μm or less, thereby improving wear resistance. When the average thickness of the entire coating layer is 2.0 μm or more, the wear resistance of the coated cutting tool according to the present embodiment is improved, and when the average thickness of the entire coating layer is 20.0 μm or less, fracture resistance is improved primarily due to suppression of peeling of the coating layer. From the same viewpoint, the average thickness of the coating layer used in the present embodiment is more preferably 3.0 μm or more and 19.5 μm or less, and even more preferably 4.0 μm or more and 19.1 μm or less.

Note that the average thickness of each layer and the entire coating layer of the coated cutting tool according to the present embodiment can be obtained by measuring the thickness of each layer or the thickness of the entire coating layer from cross sections in three or more locations of each layer or the entire coating layer, and calculating the arithmetic mean value.

Lower Layer

The lower layer used in the present embodiment contains a compound having a composition represented by the following Formula (1)

$$(Al_xTi_{1-x})N \quad (1)$$

where, in Formula (1), x represents an atomic ratio of Al element to a sum of Al element and Ti element, and $0.70 \leq x \leq 0.90$ is satisfied.

By being provided with such a lower layer between the substrate and the upper layer, the wear resistance and the adhesion of the coated cutting tool according to the present embodiment are improved.

When the atomic ratio x of the Al element in the above Formula (1) is 0.70 or more, the hardness of the coating layer improves due to solid solution strengthening, and thus wear resistance is improved, and also oxidation resistance improves due to increased Al content. As a result, the coated cutting tool according to the present embodiment has improved crater wear resistance, and accordingly fracture resistance is improved by suppressing deterioration in strength of the cutting edge. Also, when the atomic ratio x of the Al element in the above Formula (1) is 0.90 or less, the toughness of the coating layer improves due to containing Ti, and accordingly occurrence of thermal cracking can be suppressed. As a result, the fracture resistance of the coated cutting tool according to the present embodiment is improved. From the same perspective, the atomic ratio x of the Al element in the above Formula (1) is preferably 0.70 or more, and 0.89 or less.

Note that in the coated cutting tool according to the present embodiment, when the composition of the coating layer is written as $(Al_{0.80}Ti_{0.20})N$ for example, this represents that the atomic ratio of the Al element to the sum of the Al element and the Ti element is 0.80, and the atomic ratio of the Ti element to the sum of the Al element and the Ti element is 0.20. That is to say, this means that the atomic percentage of the Al element as to the sum of the Al element and the Ti element is 80 at. %, and the atomic percentage of the Ti element as to the sum of the Al element and the Ti element is 20 at. %.

It is sufficient in the present embodiment for the lower layer to contain the compound having the composition represented by the above Formula (1), and may or may not contain components other than the compound having the composition represented by the above Formula (1), as long as the operational effect of the present invention is exhibited.

The average thickness of the lower layer used in the present embodiment is 1.0 µm or more and 15.0 µm or less. The wear resistance of the coated cutting tool according to the present embodiment improves by the average thickness of the lower layer being 1.0 µm or more. Conversely, by the average thickness of the lower layer being 15.0 µm or less, in the coated cutting tool according to the present embodiment, adhesion to the substrate (e.g., cemented carbide) improves, and occurrence of thermal cracking can be suppressed, thereby improving fracture resistance. From the same perspective, the average thickness of the lower layer is preferably 1.2 µm or more and 14.0 µm or less, and more preferably is 1.4 µm or more and 13.0 µm or less.

Upper Layer

The upper layer used in the present embodiment contains an $\alpha$-$Al_2O_3$ layer containing $\alpha$-$Al_2O_3$. Due to the upper layer having the $\alpha$-$Al_2O_3$ layer containing $\alpha$-$Al_2O_3$, the coated cutting tool according to the present embodiment is hard, and accordingly wear resistance is improved.

Also, the average thickness of the upper layer of the coated cutting tool according to the present embodiment is 0.5 µm or more and 15.0 µm or less. When the average thickness of the upper layer is 0.5 µm or more, crater wear resistance of the coated cutting tool is improved. Conversely, when the average thickness of the upper layer is 15.0 µm or less, coarsening of grain size can be suppressed, and accordingly occurrence of fracturing due to chipping can be suppressed. As a result, the fracture resistance of the coated cutting tool according to the present embodiment is improved. From the same perspective, the average thickness of the upper layer is preferably 0.6 µm or more and 14.5 µm or less, and more preferably is 0.6 µm or more and 14.0 µm or less.

Also, regarding the coated cutting tool according to the present embodiment, in the $\alpha$-$Al_2O_3$ layer, the texture coefficient TC (1, 1, 6) of the (1, 1, 6) plane represented by the following Formula (2) is 2.0 or more and 6.0 or less $$TC(1, 1, 6) = \frac{I(1, 1, 6)}{I_0(1, 1, 6)} \left\{ \frac{1}{9} \sum \frac{I(h, k, l)}{I_0(h, k, l)} \right\}^{-1} \quad (2)$$

where, in Formula (2), I(h, k, l) represents peak intensity of (h, k, l) planes in X-ray diffraction of the $\alpha$-$Al_2O_3$ layer, $I_0$(h, k, l) represents standard diffraction intensity of (h, k, l) planes of $\alpha$-$Al_2O_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

Regarding the coated cutting tool according to the present embodiment, the texture coefficient TC (1, 1, 6) of the (1, 1, 6) plane represented in the above Formula (2) is 2.0 or more in the $\alpha$-$Al_2O_3$ layer, and accordingly adhesion improves, whereby fracture resistance is excellent. Conversely, regarding the coated cutting tool according to the present embodiment, when the texture coefficient TC (1, 1, 6) of the (1, 1, 6) plane represented in the above Formula (2) is 6.0 or less in the $\alpha$-$Al_2O_3$ layer, the proportion of the texture coefficient TC relatively increases in the (0, 0, 12) plane or the (0, 2, 10) plane, and accordingly crater wear resistance improves. From the same perspective, in the $\alpha$-$Al_2O_3$ layer, the texture coefficient TC (1, 1, 6) of the (1, 1, 6) plane represented by the above Formula (2) is preferably 2.1 or more and 5.9 or less.

Note that in the $\alpha$-$Al_2O_3$ layer, the (1, 1, 6) plane is at an orientation inclined by 42.3° from the (0, 0, 12) plane.

Also, regarding the coated cutting tool according to the present embodiment, in the $\alpha$-$Al_2O_3$ layer, the texture coefficient TC (0, 2, 10) of the (0, 2, 10) plane (hereinafter, also written simply as "texture coefficient TC (0, 2, 10)") represented by the following Formula (3) is preferably 1.0 or more and 3.0 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

where, in Formula (3), I(h, k, l) represents peak intensity of (h, k, l) planes in X-ray diffraction of the $\alpha$-$Al_2O_3$ layer, $I_0$(h, k, l) represents standard diffraction intensity of (h, k, l) planes of $\alpha$-$Al_2O_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

Regarding the coated cutting tool according to the present embodiment, the texture coefficient TC (0, 2, 10) is 1.0 or more in the $\alpha$-$Al_2O_3$ layer, and accordingly crater wear resistance and fracture resistance tends to improve. Conversely, regarding the coated cutting tool according to the present embodiment, when the texture coefficient TC (0, 2, 10) is 3.0 or less in the $\alpha$-$Al_2O_3$ layer, adhesion with the lower layer improves, and accordingly there is a tendency for occurrence of fracture due to chipping to be able to be suppressed. As a result, the crater wear resistance and fracture resistance of the coated cutting tool according to the present embodiment tends to improve. From the same perspective, in the α-Al$_2$O$_3$ layer, the texture coefficient TC (0, 2, 10) is more preferably 1.2 or more and 2.9 or less, and even more preferably 1.3 or more and 2.8 or less.

Note that in the α-Al$_2$O$_3$ layer, the (0, 2, 10) plane has an orientation inclined by 30.8° from the (0, 0, 12) plane, and accordingly can be considered to have intermediate characteristics between the (0, 0, 12) plane and the (1, 1, 6) plane.

Also, regarding the coated cutting tool according to the present embodiment, in the α-Al$_2$O$_3$ layer, the texture coefficient TC (0, 0, 12) of the (0, 0, 12) plane (hereinafter also written simply as "texture coefficient TC (0, 0, 12)") represented by the following Formula (4) is preferably 1.0 or more and 4.0 or less $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formula (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

Regarding the coated cutting tool according to the present embodiment, due to the texture coefficient TC (0, 0, 12) in the α-Al$_2$O$_3$ layer being 1.0 or more, crater wear resistance tends to improve. Conversely, regarding the coated cutting tool according to the present embodiment, when the texture coefficient TC (0, 0, 12) in the α-Al$_2$O$_3$ layer is 4.0 or less, the proportion of the texture coefficient TC relatively increases in the (1, 1, 6) plane or the (0, 2, 10) plane, adhesion to the lower layer improves, and accordingly there is a tendency for occurrence of fracture due to chipping to be able to be suppressed. As a result, the fracture resistance of the coated cutting tool according to the present embodiment tends to improve. From the same perspective, in the α-Al$_2$O$_3$ layer, the texture coefficient TC (0, 0, 12) is preferably 1.2 or more and 3.8 or less.

Also, regarding the coated cutting tool according to the present embodiment, in the α-Al$_2$O$_3$ layer, the sum of the texture coefficient TC (1, 1, 6), the texture coefficient TC (0, 2, 10), and the texture coefficient TC (0, 0, 12) is preferably 5.0 or more and 8.5 or less.

Regarding the coated cutting tool according to the present embodiment, due to the sum of the texture coefficient TC (1, 1, 6), the texture coefficient TC (0, 2, 10), and the texture coefficient TC (0, 0, 12) being 5.0 or more in the α-Al$_2$O$_3$ layer, crater wear resistance and fracture resistance tend to be improved. Conversely, regarding the coated cutting tool according to the present embodiment, when the sum of the texture coefficient TC (1, 1, 6), the texture coefficient TC (0, 2, 10), and the texture coefficient TC (0, 0, 12) is 8.5 or less in the α-Al$_2$O$_3$ layer, manufacturing is facilitated. From the same perspective, in the α-Al$_2$O$_3$ layer, the sum of the texture coefficient TC (1, 1, 6), the texture coefficient TC (0, 2, 10), and the texture coefficient TC (0, 0, 12) is more preferably 6.0 or more and 8.3 or less, and is even more preferably 6.4 or more and 8.0 or less.

Note that in the present embodiment, each texture coefficient TC of the of the α-Al$_2$O$_3$ layer can be measured by a method described in later-described Examples.

Also, in the coated cutting tool according to the present embodiment, the average grain size of grains of the α-Al$_2$O$_3$ layer is preferably 0.2 μm or more and 0.5 μm or less. Regarding the coated cutting tool according to the present embodiment, due to the average grain size of grains of the α-Al$_2$O$_3$ layer being 0.2 μm or more, manufacturing is facilitated. Conversely, regarding the coated cutting tool according to the present embodiment, when the average grain size of grains of the α-Al$_2$O$_3$ layer is 0.5 μm or less, there is a tendency for occurrence of fracture due to chipping to be able to be suppressed. As a result, the fracture resistance of the coated cutting tool according to the present embodiment tends to improve. From the same perspective, the average grain size of grains of the α-Al$_2$O$_3$ layer is more preferably 0.2 μm or more and 0.4 μm or less.

Note that in the present embodiment, the average grain size of grains of the α-Al$_2$O$_3$ layer can be measured by a method described in later-described Examples.

Also, in the present embodiment, the upper layer may contain α-type aluminum oxide (α-Al$_2$O$_3$), and may or may not contain components other than α-type aluminum oxide (α-Al$_2$O$_3$), as long as the operational effect of the present invention is exhibited.

In the coated cutting tool according to the present embodiment, the layers configuring the coating layer may be formed by chemical vapor deposition, or may be formed by physical vapor deposition. The following method is a specific example of a method of forming the layers, for example. Note however, that the formation method of the layers is not limited to this.

Chemical Vapor Deposition

First, the lower layer is formed on the surface of the substrate by chemical vapor deposition. Next, the upper layer is formed on the surface of the lower layer by chemical vapor deposition.

Lower Layer Forming Process

The lower layer can be formed by chemical vapor deposition at a temperature of 700° C. to 900° C. and a pressure of 3.0 hPa to 5.0 hPa, using a raw material composition of 0.2 mol % to 0.5 mol % of TiCl$_4$, 0.5 mol % to 2.0 mol % of AlCl$_3$, 2.0 mol % to 5.0 mol % of NH$_3$, and the balance H$_2$.

In order to control the composition of the lower layer represented in the above Formula (1), the raw material composition in the lower layer forming process can be adjusted as appropriate. More specifically, the method of controlling the ratio of Ti and Al may be used. For example, when the proportion of the raw materials AlCl$_3$/(AlCl$_3$+TiCl$_4$) is great in the lower layer forming process, the atomic ratio x of the Al element in the composition represented in the above Formula (1) tends to be great. Specifically, by making the proportion of AlCl$_3$/(AlCl$_3$+TiCl$_4$) in the raw material composition to be 0.70 or more and 0.90 or less for example, the atomic ratio x of the Al element in the composition represented in the above Formula (1) tends to be able to be controlled to the above particular range.

Upper Layer Forming Process

As for the upper layer, for example, the α-Al$_2$O$_3$ layer containing α-Al$_2$O$_3$ (hereinafter also referred to simply as "Al$_2$O$_3$ layer") can be formed as follows.

First, nuclei for the α-Al$_2$O$_3$ layer are formed upon the surface of the lower layer (nucleation process). The nucleation process of the α-Al$_2$O$_3$ layer is performed under conditions of a temperature of 750° C. to 850° C. and a pressure of 60 hPa to 80 hPa, using a raw material composition of 1.0 mol % to 2.5 mol % of $AlCl_3$, 0.05 mol % to 2.0 mol % of CO, 1.0 mol % to 3.0 mol % of $CO_2$, 2.0 mol % to 3.0 mol % of HCl, and the balance $H_2$. The duration of the nucleation process is preferably three to seven minutes.

Thereafter, the $\alpha$-$Al_2O_3$ layer is formed by chemical vapor deposition under conditions of a temperature of 750° C. to 850° C. and a pressure of 60 hPa to 80 hPa, using a raw material composition of 1.0 mol % to 2.5 mol % of $AlCl_3$, 1.2 mol % to 2.5 mol % of $CO_2$, 2.0 mol % to 3.0 mol % of HCl, 0.05 mol % to 0.15 mol % of $H_2S$, and the balance $H_2$ (film forming process).

Examples of methods to control the texture coefficient TC (1, 1, 6) of the $\alpha$-$Al_2O_3$ layer in the upper layer to the above particular range include a method of adjusting the amount of $AlCl_3$ as appropriate, and a method of adjusting the amount of the $CO_2$ as appropriate, in the raw material composition, in the upper layer forming process (nucleation process and film forming process). Specifically, when the amount of $AlCl_3$ in the raw material composition is reduced in the upper layer forming process for example, the texture coefficient TC (1, 1, 6) in the $\alpha$-$Al_2O_3$ layer tends to become great. Although the reason for this tendency is not completely understood, it is conceivable that the growth speed of already-existing $Al_2O_3$ nuclei is slow, and a state in which new nucleation readily occurs is in effect, for example. The term "already-existing nuclei" means nuclei that are already generated. When the amount of $AlCl_3$ is reduced in the raw material composition in the upper layer forming process, the growth speed of already-existing $Al_2O_3$ nuclei becomes slow, and accordingly different $Al_2O_3$ nuclei are newly generated while the already-existing nuclei grow. It is estimated that in this case, these nuclei quickly come into contact with the different new $Al_2O_3$ nuclei before the already-existing $Al_2O_3$ nuclei grow in a direction parallel to the surface of the substrate, and the angle gradient of the grain boundary becomes large. It is conceivable that as a result thereof, the proportion of $\alpha$-$Al_2O_3$ crystals oriented to the (1, 1, 6) face increases. Also, by reducing the amount of $CO_2$ in the raw material composition, the texture coefficient TC (1, 1, 6) in the $\alpha$-$Al_2O_3$ layer tends to become great. Although the reason for this tendency is not completely understood, it is conceivable as being the effects of the growth speed of $Al_2O_3$ nuclei, for example.

Also, examples of methods to control the texture coefficient TC (0, 2, 10) of the $\alpha$-$Al_2O_3$ layer in the upper layer to the above particular range include a method of adjusting the amount of $AlCl_3$ as appropriate, and a method of adjusting the amount of the $CO_2$ as appropriate, in the raw material composition, in the upper layer forming process (nucleation process and film forming process). Specifically, when the amount of the raw material composition of $AlCl_3$ is reduced in the upper layer forming process for example, the texture coefficient TC (0, 2, 10) in the $\alpha$-$Al_2O_3$ layer tends to become great. Although the reason for this tendency is not completely understood, it is conceivable that the growth speed of already-existing $Al_2O_3$ nuclei is slow, and a state in which new nucleation readily occurs is in effect, in the same way as the above-described, for example. Also, by reducing the amount of $CO_2$ in the raw material composition, the texture coefficient TC (0, 2, 10) in the $\alpha$-$Al_2O_3$ layer tends to become great. Although the reason for this tendency is not completely understood, it is conceivable as being the effects of the growth speed of already-existing $Al_2O_3$ nuclei, for example. Note however, that when the texture coefficient TC (1, 1, 6) in the $\alpha$-$Al_2O_3$ layer becomes extremely great, the texture coefficient TC (0, 2, 10) tends to be come relatively small.

Also, examples of methods to control the texture coefficient TC (0, 0, 12) of the $\alpha$-$Al_2O_3$ layer in the upper layer to the above particular range include a method of adjusting the amount of $AlCl_3$ in the raw material composition as appropriate in the upper layer forming process (nucleation process and film forming process). Specifically, when the amount of $AlCl_3$ in the raw material composition is increased in the upper layer forming process for example, the texture coefficient TC (0, 0, 12) in the $\alpha$-$Al_2O_3$ layer tends to become great.

Examples of methods to control the average grain size of the grains in the $\alpha$-$Al_2O_3$ layer in the upper layer to the above particular range include adjusting the temperature as appropriate, adjusting the amount of $AlCl_3$ in the raw material composition as appropriate, and so forth, in the upper layer forming process. Specifically, lowering the temperature in the upper layer forming process, for example, tends to reduce the average grain size of the grains in the $\alpha$-$Al_2O_3$ layer. Also, when the amount of $AlCl_3$ in the raw material composition is reduced, the average grain size of grains in the $\alpha$-$Al_2O_3$ layer tend to be small. More specifically, setting the temperature to 750° C. to 850° C. and the amount of $AlCl_3$ in the raw material composition to 1.0 mol % to 2.5 mol %, for example, in the upper layer forming process (nucleation process and film forming process) tends to enable controlling the average grain size of the grains in the $\alpha$-$Al_2O_3$ layer to the above particular range.

It is estimated that smoothing the interface with the lower layer that comes into contact with the upper layer also affects the average grain size of the grains in the $\alpha$-$Al_2O_3$ layer.

The thickness of each layer in the coating layer of the coated cutting tool of the present embodiment can be measured by observing the cross-sectional structure of the coated cutting tool using an optical microscope, a scanning electron microscope (SEM), a field-emission SEM (FE-SEM), or the like. Note that the average thickness of each layer of the coated cutting tool of the present embodiment can be found by measuring the thickness of each layer at three or more locations in the vicinity of a position of 50 μm from the edge line of the cutting edge toward the center of the rake face of the coated cutting tool and finding the arithmetic mean value thereof. Also, the composition of each layer in the coating layer can be measured from the cross-sectional structure of the coated cutting tool of the present embodiment using an energy dispersive X-ray spectrometer (EDS), a wavelength dispersive X-ray spectrometer (WDS), or the like.

The coated cutting tool according to the present embodiment is considered to have advantages of extended tool life over the conventional, due to having excellent fracture resistance and wear resistance. Note however, that factors that can extend tool life are not limited to the above.

Examples

Hereinafter, the present invention will be described in more detail with reference to Examples, but the present invention is not limited to these Examples.

As a substrate, a cemented carbide was prepared that was processed to an insert shape according to ISO Standard SEMT13T3, and that had a composition of 87.2% of WC, 12.0% of Co, and 0.8% of $Cr_3C_2$ (% by mass, for the above). This substrate was subjected to round honing on the edge line of the cutting edge with a SiC brush, following which the surface of the substrate was cleansed.

Invention Samples 1 to 21 and Comparative Samples 1 to 9

With regard to invention samples 1 to 21 and comparative samples 1 to 9, after cleaning the surface of the substrate, a coating layer was formed by chemical vapor deposition as follows. First, the substrate was loaded into an external-heating chemical vapor deposition apparatus, and a lower layer having the composition shown in Table 1 was formed on the surface of the substrate under the conditions of the raw material composition, temperature, and pressure shown in Table 2 to obtain the average thickness shown in Table 1. Thereafter, nuclei of an $\alpha$-$Al_2O_3$ layer were formed on the surface of the lower layer under the conditions shown in Table 3. After nucleation of the $\alpha$-$Al_2O_3$ layer, an upper layer having the composition shown in Table 1 was formed on the surface of the lower layer under the conditions of the raw material composition, temperature and pressure shown in Table 4, so as to obtain the average thickness shown in Table 1. Note that no upper layer was formed on the comparative sample 9. Thus, coated cutting tools of the invention samples 1 to 21 and the comparative samples 1 to 9 were obtained.

TABLE 1

| | Coating layer | | | | | |
|---|---|---|---|---|---|---|
| | Lower layer $(Al_xTi_{1-x})N$ | | Upper layer | | | |
| Sample | Atomic ratio x | Average thickness (μm) | Composition | Crystal system | Average thickness (μm) | Average thickness of entire coating layer (μm) |
| Invention sample 1 | 0.80 | 6.2 | $Al_2O_3$ | α | 4.0 | 10.2 |
| Invention sample 2 | 0.79 | 6.2 | $Al_2O_3$ | α | 4.0 | 10.2 |
| Invention sample 3 | 0.79 | 6.2 | $Al_2O_3$ | α | 4.0 | 10.2 |
| Invention sample 4 | 0.80 | 6.2 | $Al_2O_3$ | α | 4.0 | 10.2 |
| Invention sample 5 | 0.80 | 6.2 | $Al_2O_3$ | α | 4.0 | 10.2 |
| Invention sample 6 | 0.80 | 6.2 | $Al_2O_3$ | α | 4.0 | 10.2 |
| Invention sample 7 | 0.70 | 6.0 | $Al_2O_3$ | α | 4.0 | 10.0 |
| Invention sample 8 | 0.89 | 6.0 | $Al_2O_3$ | α | 4.0 | 10.0 |
| Invention sample 9 | 0.80 | 1.4 | $Al_2O_3$ | α | 5.5 | 6.9 |
| Invention sample 10 | 0.80 | 13.0 | $Al_2O_3$ | α | 4.0 | 17.0 |
| Invention sample 11 | 0.80 | 6.2 | $Al_2O_3$ | α | 0.6 | 6.8 |
| Invention sample 12 | 0.80 | 3.0 | $Al_2O_3$ | α | 14.0 | 17.0 |
| Invention sample 13 | 0.80 | 6.2 | $Al_2O_3$ | α | 3.8 | 10.0 |
| Invention sample 14 | 0.80 | 6.2 | $Al_2O_3$ | α | 3.8 | 10.0 |
| Invention sample 15 | 0.79 | 2.0 | $Al_2O_3$ | α | 2.0 | 4.0 |
| Invention sample 16 | 0.79 | 9.5 | $Al_2O_3$ | α | 9.6 | 19.1 |
| Invention sample 17 | 0.86 | 6.2 | $Al_2O_3$ | α | 4.0 | 10.2 |
| Invention sample 18 | 0.74 | 6.2 | $Al_2O_3$ | α | 4.0 | 10.2 |
| Invention sample 19 | 0.81 | 7.5 | $Al_2O_3$ | α | 2.5 | 10.0 |
| Invention sample 20 | 0.81 | 2.5 | $Al_2O_3$ | α | 7.5 | 10.0 |
| Invention sample 21 | 0.81 | 6.2 | $Al_2O_3$ | α | 4.0 | 10.2 |
| Comparative sample 1 | 0.79 | 6.2 | $Al_2O_3$ | α | 4.0 | 10.2 |
| Comparative sample 2 | 0.80 | 6.2 | $Al_2O_3$ | α | 4.0 | 10.2 |
| Comparative sample 3 | 0.65 | 6.2 | $Al_2O_3$ | α | 4.0 | 10.2 |
| Comparative sample 4 | 0.95 | 6.2 | $Al_2O_3$ | α | 4.0 | 10.2 |
| Comparative sample 5 | 0.80 | 0.5 | $Al_2O_3$ | α | 6.5 | 7.0 |
| Comparative sample 6 | 0.80 | 16.0 | $Al_2O_3$ | α | 1.6 | 17.6 |
| Comparative sample 7 | 0.80 | 6.2 | $Al_2O_3$ | α | 0.2 | 6.4 |
| Comparative sample 8 | 0.80 | 1.6 | $Al_2O_3$ | α | 17.0 | 18.6 |
| Comparative sample 9 | 0.80 | 6.2 | — | — | — | 6.2 |

Note:
The "—" symbols in the table indicate that no layer is formed.

TABLE 2

| | Lower layer | | | | | | |
|---|---|---|---|---|---|---|---|
| | Temperature | Pressure | Raw material composition (mol %) | | | | $AlCl_3$/ |
| Sample | (° C.) | (hPa) | $TiCl_4$ | $AlCl_3$ | $NH_3$ | $H_2$ | $(AlCl_3 + TiCl_4)$ |
| Invention sample 1 | 750 | 3.0 | 0.3 | 1.2 | 3.5 | 95.0 | 0.80 |
| Invention sample 2 | 750 | 4.5 | 0.3 | 1.2 | 3.5 | 95.0 | 0.80 |
| Invention sample 3 | 750 | 3.0 | 0.3 | 1.2 | 3.5 | 95.0 | 0.80 |
| Invention sample 4 | 750 | 3.0 | 0.3 | 1.2 | 3.5 | 95.0 | 0.80 |
| Invention sample 5 | 750 | 3.0 | 0.3 | 1.2 | 3.5 | 95.0 | 0.80 |
| Invention sample 6 | 750 | 3.0 | 0.3 | 1.2 | 3.5 | 95.0 | 0.80 |
| Invention sample 7 | 750 | 3.5 | 0.2 | 0.5 | 3.5 | 95.8 | 0.71 |
| Invention sample 8 | 750 | 3.0 | 0.3 | 2.0 | 3.5 | 94.2 | 0.87 |
| Invention sample 9 | 750 | 3.0 | 0.3 | 1.2 | 2.5 | 96.0 | 0.80 |
| Invention sample 10 | 750 | 3.0 | 0.3 | 1.2 | 2.5 | 96.0 | 0.80 |
| Invention sample 11 | 700 | 3.0 | 0.3 | 1.2 | 4.5 | 94.0 | 0.80 |

TABLE 2-continued

| | Lower layer | | | | | | |
|---|---|---|---|---|---|---|---|
| | Temperature | Pressure | Raw material composition (mol %) | | | | AlCl$_3$/ |
| Sample | (° C.) | (hPa) | TiCl$_4$ | AlCl$_3$ | NH$_3$ | H$_2$ | (AlCl$_3$ + TiCl$_4$) |
| Invention sample 12 | 750 | 3.0 | 0.3 | 1.2 | 4.5 | 94.0 | 0.80 |
| Invention sample 13 | 750 | 3.0 | 0.3 | 1.2 | 3.5 | 95.0 | 0.80 |
| Invention sample 14 | 800 | 3.0 | 0.3 | 1.2 | 3.5 | 95.0 | 0.80 |
| Invention sample 15 | 750 | 3.0 | 0.4 | 1.6 | 3.5 | 94.5 | 0.80 |
| Invention sample 16 | 750 | 3.0 | 0.4 | 1.6 | 3.5 | 94.5 | 0.80 |
| Invention sample 17 | 750 | 3.0 | 0.4 | 2.0 | 3.5 | 94.1 | 0.83 |
| Invention sample 18 | 750 | 3.5 | 0.2 | 0.7 | 3.5 | 95.6 | 0.78 |
| Invention sample 19 | 750 | 3.0 | 0.3 | 1.2 | 3.5 | 95.0 | 0.80 |
| Invention sample 20 | 750 | 3.0 | 0.3 | 1.2 | 3.5 | 95.0 | 0.80 |
| Invention sample 21 | 750 | 3.0 | 0.3 | 1.2 | 3.5 | 95.0 | 0.80 |
| Comparative sample 1 | 750 | 4.5 | 0.3 | 1.2 | 3.5 | 95.0 | 0.80 |
| Comparative sample 2 | 750 | 4.5 | 0.3 | 1.2 | 3.5 | 95.0 | 0.80 |
| Comparative sample 3 | 750 | 3.0 | 0.5 | 1.0 | 3.5 | 95.0 | 0.67 |
| Comparative sample 4 | 750 | 3.0 | 0.2 | 2.3 | 3.5 | 94.0 | 0.92 |
| Comparative sample 5 | 750 | 3.0 | 0.3 | 1.2 | 2.5 | 96.0 | 0.80 |
| Comparative sample 6 | 750 | 3.0 | 0.3 | 1.2 | 2.5 | 96.0 | 0.80 |
| Comparative sample 7 | 700 | 3.0 | 0.3 | 1.2 | 4.5 | 94.0 | 0.80 |
| Comparative sample 8 | 750 | 3.0 | 0.3 | 1.2 | 4.5 | 94.0 | 0.80 |
| Comparative sample 9 | 700 | 3.0 | 0.3 | 1.2 | 4.5 | 94.0 | 0.80 |

TABLE 3

| | Upper layer (nucleation process) | | | | | | | |
|---|---|---|---|---|---|---|---|---|
| | Temperature | Pressure | Raw material composition (mol %) | | | | | Time |
| Sample | (° C.) | (hPa) | AlCl$_3$ | CO | CO$_2$ | HCl | H$_2$ | (minutes) |
| Invention sample 1 | 800 | 70 | 1.8 | 1.0 | 2.0 | 2.5 | 92.7 | 5 |
| Invention sample 2 | 820 | 70 | 1.2 | 1.0 | 1.7 | 2.5 | 93.6 | 5 |
| Invention sample 3 | 780 | 70 | 2.5 | 1.0 | 2.5 | 2.5 | 91.5 | 5 |
| Invention sample 4 | 810 | 70 | 1.5 | 1.0 | 1.5 | 2.5 | 93.5 | 5 |
| Invention sample 5 | 800 | 70 | 1.8 | 1.0 | 2.0 | 2.5 | 92.7 | 5 |
| Invention sample 6 | 780 | 70 | 2.5 | 1.0 | 1.8 | 2.5 | 92.2 | 5 |
| Invention sample 7 | 800 | 70 | 1.8 | 1.0 | 2.0 | 3.0 | 92.2 | 5 |
| Invention sample 8 | 800 | 70 | 1.8 | 1.0 | 2.0 | 3.0 | 92.2 | 5 |
| Invention sample 9 | 800 | 60 | 1.8 | 1.0 | 2.0 | 2.5 | 92.7 | 5 |
| Invention sample 10 | 800 | 60 | 1.8 | 1.0 | 2.0 | 2.5 | 92.7 | 5 |
| Invention sample 11 | 750 | 80 | 2.2 | 1.0 | 2.2 | 2.5 | 92.1 | 5 |
| Invention sample 12 | 800 | 80 | 1.8 | 1.0 | 2.0 | 2.5 | 92.7 | 5 |
| Invention sample 13 | 760 | 70 | 1.8 | 1.0 | 2.0 | 2.5 | 92.7 | 5 |
| Invention sample 14 | 850 | 70 | 1.8 | 1.0 | 2.0 | 2.5 | 92.7 | 5 |
| Invention sample 15 | 800 | 70 | 1.8 | 1.5 | 2.0 | 2.5 | 92.2 | 5 |
| Invention sample 16 | 800 | 70 | 1.8 | 1.5 | 2.0 | 2.5 | 92.2 | 5 |
| Invention sample 17 | 800 | 70 | 1.8 | 1.0 | 2.0 | 3.0 | 92.2 | 5 |
| Invention sample 18 | 800 | 70 | 1.8 | 1.0 | 2.0 | 3.0 | 92.2 | 5 |
| Invention sample 19 | 800 | 70 | 1.8 | 1.0 | 2.0 | 2.5 | 92.7 | 5 |
| Invention sample 20 | 800 | 70 | 1.8 | 1.0 | 2.0 | 2.5 | 92.7 | 5 |
| Invention sample 21 | 810 | 70 | 1.5 | 1.0 | 1.5 | 2.5 | 93.5 | 5 |
| Comparative sample 1 | 820 | 70 | 1.5 | 1.0 | 3.2 | 2.5 | 90.8 | 5 |
| Comparative sample 2 | 780 | 70 | 2.5 | 1.0 | 3.2 | 2.5 | 89.8 | 5 |
| Comparative sample 3 | 800 | 70 | 1.8 | 1.0 | 2.0 | 3.0 | 92.2 | 5 |
| Comparative sample 4 | 800 | 70 | 1.8 | 1.0 | 2.0 | 3.0 | 92.2 | 5 |
| Comparative sample 5 | 800 | 70 | 1.8 | 1.0 | 2.0 | 2.5 | 92.7 | 5 |
| Comparative sample 6 | 800 | 70 | 1.8 | 1.0 | 2.0 | 2.5 | 92.7 | 5 |
| Comparative sample 7 | 750 | 80 | 2.2 | 1.0 | 2.2 | 2.5 | 92.1 | 5 |
| Comparative sample 8 | 800 | 70 | 1.8 | 1.0 | 2.0 | 2.5 | 92.7 | 5 |
| Comparative sample 9 | No upper layer formed | | | | | | | |

TABLE 4

| | Upper layer (film forming process) | | | | | | |
|---|---|---|---|---|---|---|---|
| | Temperature | Pressure | Raw material composition (mol %) | | | | |
| Sample | (° C.) | (hPa) | $AlCl_3$ | $CO_2$ | HCl | $H_2S$ | $H_2$ |
| Invention sample 1 | 800 | 70 | 1.8 | 2.0 | 2.5 | 0.10 | 93.6 |
| Invention sample 2 | 820 | 70 | 1.2 | 1.7 | 2.5 | 0.10 | 94.5 |
| Invention sample 3 | 780 | 70 | 2.5 | 2.5 | 2.5 | 0.10 | 92.4 |
| Invention sample 4 | 810 | 70 | 1.5 | 1.5 | 2.5 | 0.10 | 94.4 |
| Invention sample 5 | 800 | 70 | 1.8 | 2.0 | 2.5 | 0.10 | 93.6 |
| Invention sample 6 | 780 | 70 | 2.5 | 1.8 | 2.5 | 0.10 | 93.1 |
| Invention sample 7 | 800 | 70 | 1.8 | 2.0 | 3.0 | 0.10 | 93.1 |
| Invention sample 8 | 800 | 70 | 1.8 | 2.0 | 3.0 | 0.10 | 93.1 |
| Invention sample 9 | 800 | 60 | 1.8 | 2.0 | 2.5 | 0.10 | 93.6 |
| Invention sample 10 | 800 | 60 | 1.8 | 2.0 | 2.5 | 0.10 | 93.6 |
| Invention sample 11 | 750 | 80 | 2.2 | 2.2 | 2.5 | 0.10 | 93.0 |
| Invention sample 12 | 800 | 80 | 1.8 | 2.0 | 2.5 | 0.10 | 93.6 |
| Invention sample 13 | 760 | 70 | 1.8 | 2.0 | 2.5 | 0.10 | 93.6 |
| Invention sample 14 | 850 | 70 | 1.8 | 2.0 | 2.5 | 0.10 | 93.6 |
| Invention sample 15 | 800 | 70 | 1.8 | 2.0 | 2.5 | 0.15 | 93.6 |
| Invention sample 16 | 800 | 70 | 1.8 | 2.0 | 2.5 | 0.15 | 93.6 |
| Invention sample 17 | 800 | 70 | 1.8 | 2.0 | 3.0 | 0.10 | 93.1 |
| Invention sample 18 | 800 | 70 | 1.8 | 2.0 | 3.0 | 0.10 | 93.1 |
| Invention sample 19 | 800 | 70 | 1.8 | 2.0 | 2.5 | 0.10 | 93.6 |
| Invention sample 20 | 800 | 70 | 1.8 | 2.0 | 2.5 | 0.10 | 93.6 |
| Invention sample 21 | 810 | 70 | 1.2 | 1.2 | 2.5 | 0.10 | 95.0 |
| Comparative sample 1 | 820 | 70 | 1.5 | 3.2 | 2.5 | 0.10 | 92.7 |
| Comparative sample 2 | 780 | 70 | 2.5 | 3.2 | 2.5 | 0.10 | 91.7 |
| Comparative sample 3 | 800 | 70 | 1.8 | 2.0 | 2.5 | 0.10 | 93.6 |
| Comparative sample 4 | 800 | 70 | 1.8 | 2.0 | 2.5 | 0.10 | 93.6 |
| Comparative sample 5 | 800 | 70 | 1.8 | 2.0 | 2.5 | 0.10 | 93.6 |
| Comparative sample 6 | 800 | 70 | 1.8 | 2.0 | 2.5 | 0.10 | 93.6 |
| Comparative sample 7 | 750 | 80 | 2.2 | 2.2 | 2.5 | 0.10 | 93.0 |
| Comparative sample 8 | 800 | 70 | 1.8 | 2.0 | 2.5 | 0.10 | 93.6 |
| Comparative sample 9 | No upper layer formed | | | | | | |

Average Thickness of Each Layer

The average thickness of each layer of the obtained samples was determined as follows. That is to say, the thickness at three locations in a cross-section in the vicinity of a position of 50 µm from the edge line of the cutting edge of the coated cutting tool toward the center of the rake surface was measured using the FE-SEM, and the arithmetic mean value was taken as the average thickness. The measurement results are shown in Table 1.

Composition of Each Layer

The composition of each layer of the obtained samples was measured using EDS in a cross-section in the vicinity of a position at up to 50 µm from the edge line of the cutting edge of the coated cutting tool toward the center of the rake surface. The measurement results are shown in Table 1.

Texture Coefficient TC

X-ray diffraction measurement with a 2θ/θ Bragg-Brentano optical system using Cu-Kα rays was performed on the obtained samples, under the conditions of output of 50 kV and 250 mA, incident-side Soller slit of 5°, divergence vertical slit of ⅔°, divergence vertical limitation slit of 5 mm, scattering slit of ⅔°, receiving-side Soller slit of 5°, receiving slit of 0.3 mm, BENT monochromator, receiving monochromatic slit of 0.8 mm, sampling width of 0.01°, scan speed of 4°/min, and 2θ measuring range of 20° to 155°. For the apparatus, an X-ray diffractometer (model "RINT TTRIII") manufactured by Rigaku Corporation was used. The peak intensity of each crystal plane of the α-$Al_2O_3$ layer was found from X-ray diffraction patterns. The texture coefficient TC (1, 1, 6), the texture coefficient TC (0, 2, 10) and the texture coefficient TC (0, 0, 12) in the α-$Al_2O_3$ layer were found from the obtained peak intensities of the crystal planes. The results are shown in Table 5.

Average Grain Size

The average grain size of grains in the α-$Al_2O_3$ layer of the obtained samples was measured using electron backscatter diffraction (EBSD) that the FE-SEM is equipped with, and the crystal systems of the grains were confirmed by X-ray diffraction measurement. Specifically, the coated cutting tool was polished using a diamond past, following which finishing polishing was performed using colloidal silica, thereby obtaining a cross-sectional composition of the coated cutting tool. Samples having the cross-sectional composition of the coated cutting tool were set in the FE-SEM, and the cross-sectional compositions of the samples were irradiated by electron beams with acceleration voltage of 15 kV and irradiation current of 0.5 nA at an incident angle of 70 degrees. The cross-sectional compositions on the flank of the coated cutting tool were measured by EBSD over a measurement range of 300 µm², at a step size of 0.1 µm. Boundaries at which there was misorientation of 5° or more at this time were defined as crystal grain boundaries, and regions surrounded by crystal grain boundaries were defined as grains. Furthermore, the grain size was obtained as the diameter of a true circle equivalent to the area of the grain. The crystal system and the average grain size were found for each identified grain in the α-$Al_2O_3$ layer. The results are shown in Table 1 and Table 5.

TABLE 5

| Sample | α-Al₂O₃ layer at upper layer | | | | | |
|---|---|---|---|---|---|---|
| | TC(1, 1, 6) | TC(0, 2, 10) | TC(0, 0, 12) | Sum of three TCs | Sum of TCs of other planes | Average grain size (μm) |
| Invention sample 1 | 3.1 | 1.8 | 2.2 | 7.1 | 1.9 | 0.3 |
| Invention sample 2 | 3.5 | 2.2 | 0.7 | 6.4 | 2.6 | 0.3 |
| Invention sample 3 | 2.1 | 1.3 | 3.4 | 6.8 | 2.2 | 0.3 |
| Invention sample 4 | 4.4 | 1.6 | 1.2 | 7.2 | 1.8 | 0.3 |
| Invention sample 5 | 2.9 | 2.8 | 2.0 | 7.7 | 1.3 | 0.3 |
| Invention sample 6 | 2.5 | 1.6 | 3.8 | 7.9 | 1.1 | 0.3 |
| Invention sample 7 | 3.0 | 1.6 | 2.4 | 7.0 | 2.0 | 0.3 |
| Invention sample 8 | 3.1 | 1.7 | 2.3 | 7.1 | 1.9 | 0.3 |
| Invention sample 9 | 3.2 | 1.8 | 2.1 | 7.1 | 1.9 | 0.4 |
| Invention sample 10 | 3.1 | 1.6 | 2.3 | 7.0 | 2.0 | 0.3 |
| Invention sample 11 | 2.6 | 1.8 | 2.5 | 6.9 | 2.1 | 0.2 |
| Invention sample 12 | 3.2 | 1.8 | 2.8 | 7.8 | 1.2 | 0.4 |
| Invention sample 13 | 3.1 | 1.8 | 2.3 | 7.2 | 1.8 | 0.2 |
| Invention sample 14 | 3.0 | 1.7 | 2.4 | 7.1 | 1.9 | 0.5 |
| Invention sample 15 | 2.8 | 1.7 | 2.5 | 7.0 | 2.0 | 0.3 |
| Invention sample 16 | 3.2 | 1.9 | 2.6 | 7.7 | 1.3 | 0.4 |
| Invention sample 17 | 3.1 | 1.8 | 2.2 | 7.1 | 1.9 | 0.3 |
| Invention sample 18 | 3.0 | 1.9 | 2.3 | 7.2 | 1.8 | 0.3 |
| Invention sample 19 | 2.9 | 1.7 | 2.5 | 7.1 | 1.9 | 0.3 |
| Invention sample 20 | 3.1 | 1.8 | 2.6 | 7.5 | 1.5 | 0.4 |
| Invention sample 21 | 5.9 | 1.3 | 0.8 | 8.0 | 1.0 | 0.2 |
| Comparative sample 1 | 1.2 | 0.9 | 0.7 | 2.8 | 6.2 | 0.4 |
| Comparative sample 2 | 0.6 | 0.7 | 3.5 | 4.8 | 4.2 | 0.3 |
| Comparative sample 3 | 3.0 | 1.6 | 2.4 | 7.0 | 2.0 | 0.3 |
| Comparative sample 4 | 3.1 | 1.7 | 2.3 | 7.1 | 1.9 | 0.3 |
| Comparative sample 5 | 3.2 | 1.8 | 2.1 | 7.1 | 1.9 | 0.4 |
| Comparative sample 6 | 3.1 | 1.6 | 2.3 | 7.0 | 2.0 | 0.3 |
| Comparative sample 7 | 2.6 | 1.8 | 2.5 | 6.9 | 2.1 | 0.2 |
| Comparative sample 8 | 3.2 | 1.8 | 2.8 | 7.8 | 1.2 | 0.4 |
| Comparative sample 9 | — | — | — | — | — | — |

Note:
The "—" symbols in the table indicate that no layer is formed.

Using the obtained invention samples 1 to 21 and comparative samples 1 to 9, cutting tests 1 and 2 were performed under the following conditions. Table 6 shows the results of the cutting tests 1 and 2.

Cutting Test 1 (Wear Resistance Test)
  Work material: SCM400
  Work material shape: cuboid of 200 mm×150 mm×80 mm
  Cutting speed: 330 m/min
  Depth of cut: 2.0 mm
  Width of cut: 75 mm
  Feed per tooth: 0.20 mm/t
  Coolant: none
  Evaluation items (wear resistance test): the tool life was assumed to have been reached when the width of wear of the flank of the sample reached 0.3 mm or more, and the amount of cutting time until the tool life was reached was measured.

Cutting Test 2: (Fracture Resistance Test)
  Work material: SCM400
  Work material shape: cuboid of 200 mm×150 mm×80 mm having six holes 30 mm in diameter
  Cutting speed: 180 m/min
  Depth of cut: 1.0 mm
  Width of cut: 100 mm
  Feed per tooth: 0.30 mm/t
  Coolant: none
  Evaluation items (fracture resistance test): the tool life was assumed to have been reached when the sample exhibited chipping (0.2 mm or more in width) or fracture, and the number of times of cutting until the tool life was reached was counted. Note that with regard to the number of times of cutting, passing back and forth over the upper face of the cuboid working material (200 mm×150 mm face of working material) several times until the entire face is cut was counted as one time (one pass).

With regard to the cutting time until the tool life was reached in the cutting test 1 (wear resistance test), 40 minutes or longer was evaluated as "A", 30 minutes or more and less than 40 minutes as "B", and less than 30 minutes as "C". Also, with regard to the number of times until the tool life was reached in the cutting test 2 (fracture resistance test), eight times or more was evaluated as "A", five times or more and less than eight times as "B", and less than five times as "C". In these evaluations, "A" means superior, "B" means good, and "C" means inferior. An evaluation for "A" or "B" for the cutting time in the cutting test 1 and also an evaluation for "A" or "B" for the number of times in the cutting test 2 means excellent cutting performance. The obtained evaluation results are shown in Table 6

TABLE 6

| | Wear resistance Cutting test 1 | | Fracture resistance Cutting test 2 | |
|---|---|---|---|---|
| Sample | Tool life (minutes) | Evaluation | Tool life (times) | Evaluation |
| Invention sample 1 | 47 | A | 12 | A |
| Invention sample 2 | 35 | B | 14 | A |
| Invention sample 3 | 49 | A | 8 | A |
| Invention sample 4 | 37 | B | 16 | A |
| Invention sample 5 | 46 | A | 12 | A |
| Invention sample 6 | 53 | A | 9 | A |
| Invention sample 7 | 42 | A | 10 | A |

TABLE 6-continued

| Sample | Wear resistance Cutting test 1 | | Fracture resistance Cutting test 2 | |
|---|---|---|---|---|
| | Tool life (minutes) | Evaluation | Tool life (times) | Evaluation |
| Invention sample 8 | 44 | A | 10 | A |
| Invention sample 9 | 33 | B | 8 | A |
| Invention sample 10 | 59 | A | 6 | B |
| Invention sample 11 | 30 | B | 6 | B |
| Invention sample 12 | 61 | A | 7 | B |
| Invention sample 13 | 46 | A | 13 | A |
| Invention sample 14 | 42 | A | 6 | B |
| Invention sample 15 | 30 | B | 5 | B |
| Invention sample 16 | 65 | A | 5 | B |
| Invention sample 17 | 45 | A | 11 | A |
| Invention sample 18 | 43 | A | 12 | A |
| Invention sample 19 | 36 | B | 8 | A |
| Invention sample 20 | 55 | A | 9 | A |
| Invention sample 21 | 33 | B | 18 | A |
| Comparative sample 1 | 29 | C | 3 | C |
| Comparative sample 2 | 46 | A | 1 | C |
| Comparative sample 3 | 39 | B | 3 | C |
| Comparative sample 4 | 43 | A | 1 | C |
| Comparative sample 5 | 22 | C | 5 | B |
| Comparative sample 6 | 21 | C | 2 | C |
| Comparative sample 7 | 25 | C | 2 | C |
| Comparative sample 8 | 16 | C | 1 | C |
| Comparative sample 9 | 23 | C | 1 | C |

From the results shown in Table 6, it was found that the evaluation for the cutting time and the evaluation for the number of times of cutting were both "A" or "B" for the invention samples, indicating excellence in both wear resistance and fracture resistance. Conversely, it was found that one or both of the evaluation for the cutting time and the evaluation for the number of times of cutting were "C" for the comparative samples, indicating inferiority in wear resistance and/or fracture resistance as compared to the invention samples.

From the above results, it was found that the invention samples had a long tool life as a result of both of excellent wear resistance and fracture resistance.

INDUSTRIAL APPLICABILITY

Since the coated cutting tool of the present invention has excellent wear resistance and fracture resistance, the tool life can be extended as compared with the conventional cutting tools, and therefore, from such a viewpoint, the coated cutting tool of the present invention has industrial applicability.

REFERENCE SIGNS LIST

1: substrate, 2: lower layer, 3: upper layer, 4: coating layer, 5: coated cutting tool.

What is claimed is:

1. A coated cutting tool, comprising:
a substrate; and
a coating layer formed on a surface of the substrate, wherein
the coating layer includes a lower layer and an upper layer in this order from the substrate side toward the surface side of the coating layer, and the upper layer is formed on a surface of the lower layer,
the lower layer contains a compound having a composition represented by the following Formula (1)

$$(Al_xTi_{1-x})N \quad (1)$$

where, in Formula (1), x represents an atomic ratio of an Al element as to a sum of the Al element and a Ti element, and $0.70 \leq x \leq 0.90$ is satisfied,
an average thickness of the lower layer is 1.0 μm or more and 15.0 μm or less,
the upper layer contains an $\alpha$-$Al_2O_3$ layer containing $\alpha$-$Al_2O_3$,
an average thickness of the upper layer is 0.5 μm or more and 15.0 μm or less, and
in the $\alpha$-$Al_2O_3$ layer, a texture coefficient TC (1, 1, 6) of a (1, 1, 6) plane represented by the following Formula (2) is 2.0 or more and 6.0 or less $$TC(1, 1, 6) = \frac{I(1, 1, 6)}{I_0(1, 1, 6)} \left\{ \frac{1}{9} \sum \frac{I(h, k, l)}{I_0(h, k, l)} \right\}^{-1} \quad (2)$$

where, in Formula (2), I(h, k, l) represents peak intensity of (h, k, l) planes in X-ray diffraction of the $\alpha$-$Al_2O_3$ layer, $I_0$(h, k, l) represents standard diffraction intensity of (h, k, l) planes of $\alpha$-$Al_2O_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

2. The coated cutting tool according to claim 1, wherein in the $\alpha$-$Al_2O_3$ layer, a texture coefficient TC (0, 2, 10) of a (0, 2, 10) plane represented by the following Formula (3) is 1.0 or more and 3.0 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

where, in Formula (3), I(h, k, l) represents peak intensity of (h, k, l) planes in X-ray diffraction of the $\alpha$-$Al_2O_3$ layer, $I_0$(h, k, l) represents standard diffraction intensity of (h, k, l) planes of $\alpha$-$Al_2O_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

3. The coated cutting tool according to claim 1, wherein in the $\alpha$-$Al_2O_3$ layer, a texture coefficient TC (0, 0, 12) of a (0, 0, 12) plane represented by the following Formula (4) is 1.0 or more and 4.0 or less $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formula (4), I(h, k, l) represents peak intensity of (h, k, l) planes in X-ray diffraction of the $\alpha$-$Al_2O_3$ layer, $I_0$(h, k, l) represents standard diffraction intensity of (h, k, l) planes of $\alpha$-$Al_2O_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

4. The coated cutting tool according to claim 1, wherein in the $\alpha$-$Al_2O_3$ layer, a sum of the texture coefficient TC (1, 1, 6), the texture coefficient TC (0, 2, 10) of the (0, 2, 10) plane represented by the following Formula (3), and the texture coefficient TC (0, 0, 12) of the (0, 0, 12) plane represented by the following Formula (4) is 5.0 or more and 8.5 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formulas (3) and (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

5. The coated cutting tool according to claim 1, wherein an average grain size of grains of the α-Al$_2$O$_3$ layer is 0.2 μm or more and 0.5 μm or less.

6. The coated cutting tool according to claim 1, wherein an average thickness of the entire coating layer is 2.0 μm or more and 20.0 μm or less.

7. The coated cutting tool according to claim 1, wherein the substrate is any of a cemented carbide, a cermet, a ceramic, or a cubic boron nitride sintered body.

8. The coated cutting tool according to claim 2, wherein in the α-Al$_2$O$_3$ layer, a texture coefficient TC (0, 0, 12) of a (0, 0, 12) plane represented by the following Formula (4) is 1.0 or more and 4.0 or less $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formula (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

9. The coated cutting tool according to claim 2, wherein in the α-Al$_2$O$_3$ layer, a sum of the texture coefficient TC (1, 1, 6), the texture coefficient TC (0, 2, 10) of the (0, 2, 10) plane represented by the following Formula (3), and a texture coefficient TC (0, 0, 12) of the (0, 0, 12) plane represented by the following Formula (4) is 5.0 or more and 8.5 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formulas (3) and (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

10. The coated cutting tool according to claim 3, wherein in the α-Al$_2$O$_3$ layer, a sum of the texture coefficient TC (1, 1, 6), a texture coefficient TC (0, 2, 10) of the (0, 2, 10) plane represented by the following Formula (3), and the texture coefficient TC (0, 0, 12) of the (0, 0, 12) plane represented by the following Formula (4) is 5.0 or more and 8.5 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formulas (3) and (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

11. The coated cutting tool according to claim 8, wherein in the α-Al$_2$O$_3$ layer, a sum of the texture coefficient TC (1, 1, 6), the texture coefficient TC (0, 2, 10) of the (0, 2, 10) plane represented by the following Formula (3), and the texture coefficient TC (0, 0, 12) of the (0, 0, 12) plane represented by the following Formula (4) is 5.0 or more and 8.5 or less $$TC(0, 2, 10) = \frac{I(0, 2, 10)}{I_0(0, 2, 10)} \left\{ \frac{1}{9} \sum \frac{I(h, k, l)}{I_0(h, k, l)} \right\}^{-1} \quad (3)$$

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (4)$$

where, in Formulas (3) and (4), I(h, k, l) represents peak intensity of (h, k, l) planes in X-ray diffraction of the α-Al$_2$O$_3$ layer, I$_0$(h, k, l) represents standard diffraction intensity of (h, k, l) planes of α-Al$_2$O$_3$ according to JCPDS Card No. 10-0173, and (h, k, l) represents nine crystal planes of (0, 1, 2), (1, 0, 4), (1, 1, 3), (0, 2, 4), (1, 1, 6), (1, 2, 4), (3, 0, 0), (0, 0, 12), and (0, 2, 10).

12. The coated cutting tool according to claim 2, wherein an average grain size of grains of the α-Al$_2$O$_3$ layer is 0.2 μm or more and 0.5 μm or less.

13. The coated cutting tool according to claim 3, wherein an average grain size of grains of the α-Al$_2$O$_3$ layer is 0.2 μm or more and 0.5 μm or less.

14. The coated cutting tool according to claim 4, wherein an average grain size of grains of the α-Al$_2$O$_3$ layer is 0.2 μm or more and 0.5 μm or less.

15. The coated cutting tool according to claim 8, wherein an average grain size of grains of the α-Al$_2$O$_3$ layer is 0.2 μm or more and 0.5 μm or less.

16. The coated cutting tool according to claim 9, wherein an average grain size of grains of the α-Al$_2$O$_3$ layer is 0.2 μm or more and 0.5 μm or less.

17. The coated cutting tool according to claim 10, wherein an average grain size of grains of the α-Al$_2$O$_3$ layer is 0.2 μm or more and 0.5 μm or less.

18. The coated cutting tool according to claim 11, wherein an average grain size of grains of the α-Al$_2$O$_3$ layer is 0.2 μm or more and 0.5 μm or less.

19. The coated cutting tool according to claim 2, wherein an average thickness of the entire coating layer is 2.0 μm or more and 20.0 μm or less.

20. The coated cutting tool according to claim 3, wherein an average thickness of the entire coating layer is 2.0 μm or more and 20.0 μm or less.

* * * * *